US007821026B2

(12) United States Patent  
Yu et al.

(10) Patent No.: US 7,821,026 B2
(45) Date of Patent: Oct. 26, 2010

(54) LIGHT EMITTING DIODE DEVICE AND MANUFACTURING METHOD THEROF

(75) Inventors: Kuo-Hui Yu, Hsinchu (TW); Yu-Cheng Yang, Hsinchu (TW); Cheng-Ta Kuo, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/230,887

(22) Filed: Sep. 8, 2008

(65) Prior Publication Data
US 2009/0065794 A1 Mar. 12, 2009

(30) Foreign Application Priority Data
Sep. 7, 2007 (TW) .............................. 96133779 A

(51) Int. Cl.
H01L 33/00 (2010.01)
(52) U.S. Cl. .................. 257/99; 257/E33.064
(58) Field of Classification Search .................. 257/99, 257/98, E33.064, E33.068
See application file for complete search history.

(56) References Cited

U.S. PATENT DOCUMENTS
2009/0065794 A1* 3/2009 Yu et al. ........................ 257/98

* cited by examiner

Primary Examiner—Mark Prenty
(74) Attorney, Agent, or Firm—Bacon & Thomas, PLLC

(57) ABSTRACT

A light-emitting diode (LED) device and manufacturing methods thereof are provided, wherein the LED device comprises a substrate, a first type conductivity semiconductor layer, an active layer, a second type conductivity semiconductor layer, a transparent conductive oxide stack structure, a first electrode, and a second electrode. The first semiconductor layer on the substrate has a first portion and a second portion. The active layer and the second semiconductor layer are subsequently set on the first portion. The transparent conductive oxide stack structure on the second semiconductor layer has at least two resistant interfaces. The first electrode is above the second portion, and the second electrode is above the transparent conductive oxide stack structure.

18 Claims, 10 Drawing Sheets

LIGHT EMITTING DIODE DEVICE AND MANUFACTURING METHOD THEROF

BACKGROUND

1. Technical Field

A light-emitting diode (LED) device and manufacturing methods thereof are provided, and more particularly to a LED device having a transparent conductive oxide (TCO) stack structure and manufacturing methods thereof.

2. Reference to Related Application

This application claims the right of priority based on TW application Ser. No. 096133779, filed Sep. 7, 2007, entitled "LIGHT-EMITTING DIODE DEVICE AND MANUFACTURING METHOD THEREOF", and the contents of which are incorporated herein by reference.

3. Description of the Related Art

The light-emitting diodes (LEDs) of the solid-state lighting elements have the characteristics of low power consumption, low heat generation, long operational life, shockproof, small volume, quick response and good opto-electrical property like emitting stable wavelength and so on, so the LEDs have been widely used in household appliances, indicator light of instruments, optics and photonics products, etc. As the optics and photonics technology develops, the solid-state lighting elements have great progress in increasing the light efficiency, operation life and the brightness. LEDs become the main stream of the lighting devices in the near future.

FIG. 1 shows a cross-sectional view of conventional light-emitting diode device 100. The conventional light-emitting diode device includes a substrate 101, an n-type semiconductor layer 102 epitaxially grown on the substrate 101, an active layer 103, a p-type semiconductor layer 104, a front side electrode 105, and a back side electrode 106 wherein the front side electrode 105 is disposed on the light extraction side of the light-emitting diode device 100 and the back side electrode 106 is formed on the side of the substrate 101 where no epitaxial structure formed on. The driving current R1 is driven from the front side electrode 105 to the p-type semiconductor layer 104, and through the active layer 103 having a double heterostructure or a multi-quantum well structure to emit light. Generally speaking, in order to improve the light efficiency of the light-emitting diode device 100, the current from the front side electrode 105 needs to be spread to the edge of the light-emitting diode device 100 effectively to make the active layer 103 emit light uniformly.

Because of the high contact resistance between the semiconductor layer and the metal electrode of the light-emitting diode device 100, the current R1 cannot spread to the active layer 103 effectively. The current R1 normally flows with the shortest pathway passing through the active layer 103 to the back side electrode 106 and the current crowding effect is therefore occurred. It restrains the lighting area in a portion of the active layer 103 below the front side electrode 105, and greatly influences the light efficiency of the active layer 103.

A known art to resolve the issue is to form a current blocking layer of native conductive oxide by thermal annealing the transparent electrode, or to form a thin film of p-type metal oxide like $Li_xNi_{1-x}O$ or a p-type nitride like ZrAlN between the outer layer of the p-type epitaxial stack and the transparent electrode of the light-emitting diode to combine with the transparent electrode so the current from the transparent electrode to the light-emitting diode spreads uniformly and the light efficiency of the active layer 103 is increased.

Nevertheless, the native conductive oxide or the hybrid transparent electrode of the p-type metal oxide like $Li_xNi_{1-x}O$ or the p-type nitride like ZrAlN have the issue of the high contact resistance with the stack structure of the light-emitting diode. In order to lower the contact resistance, small band gap semiconductor materials are needed to form the stack structure. The flexibility to choose material is therefore limited, and the light efficiency of the light-emitting diode is indirectly influenced because of the high operation voltage.

Therefore, a light-emitting diode having low contact resistance, efficient current spreading and better light efficiency with simpler processes is needed.

SUMMARY

A light-emitting diode device is disclosed including a substrate, a first type conductivity semiconductor layer, an active layer, a second type conductivity semiconductor layer, a transparent conductive oxide stack structure, a first electrode, and a second electrode. The first type conductivity semiconductor layer on the substrate has a first portion and a second portion. The active layer is subsequently formed on the first portion. The second type conductivity semiconductor layer is formed on the active layer. The transparent conductive oxide stack structure formed on the second semiconductor layer has at least two resistant interfaces. The first electrode is formed on the second portion, and the second electrode is formed on the transparent conductive oxide stack structure.

A manufacturing process of the light-emitting diode device is disclosed wherein the process including providing a growth substrate; forming a first type conductivity semiconductor layer on the substrate; forming an active layer on the first semiconductor layer; forming a second type conductivity semiconductor layer on the active layer; removing a portion of the second semiconductor layer and the active layer to expose a portion of the first semiconductor layer; forming a transparent conductive oxide stack structure having at least two resistant interfaces on the remaining portion of the second semiconductor layer; forming a first electrode on the exposed portion of the first semiconductor layer, and forming a second electrode on the transparent conductive oxide stack structure.

A manufacturing process of the light-emitting diode device is disclosed wherein the process including providing a growth substrate; forming a first type conductivity semiconductor layer on the substrate; forming an active layer on the first semiconductor layer; forming a second type conductivity semiconductor layer on the active layer; forming a reflecting layer on the second semiconductor layer and adhering a permanent substrate to the reflecting layer. Then, removing the growth substrate; forming the transparent conductive oxide stack structure having at least two resistant interfaces on the first semiconductor layer; forming a first electrode on the transparent conductive oxide stack structure and forming a second electrode on the opposite side of the adhering side of the permanent substrate.

A manufacturing process of the light-emitting diode device is disclosed wherein the process including providing a growth substrate; forming a first type conductivity semiconductor layer on the substrate; forming an active layer on the first semiconductor layer; forming a second type conductivity semiconductor layer on the active layer; forming a transparent conductive oxide stack structure having at least two resistant interfaces on the second semiconductor layer; forming a reflecting layer on the transparent conductive oxide stack structure and adhering a permanent substrate to the reflecting layer; removing the growth substrate; forming a first electrode on the first type conductivity semiconductor layer and forming a second electrode on the opposite side of the adhering side of the permanent substrate.

The process like evaporation process is adopted in the embodiments described above; a transparent conductive oxide stack structure having at least two resistant interfaces is formed between the semiconductor stack structure and the electrode of the light-emitting diode device. It can spread the currents derived from the electrode to the active layer of the light-emitting diode device efficiently to solve the issues of current crowding effect and the overhigh operation voltage of the conventional light-emitting diode device. The present invention therefore has the advantages of simpler processes, low operation voltage and better light efficiency.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
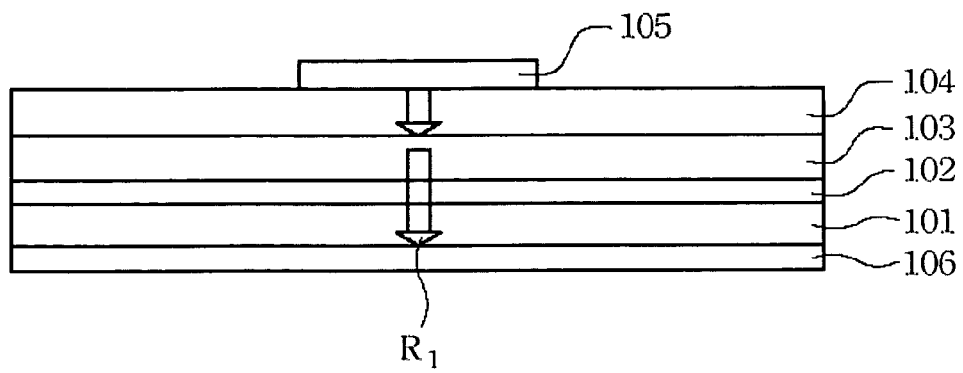
FIG. 1 is a cross-sectional view of conventional light-emitting diode 100.

Reference is made in detail to the preferred embodiments of the present invention, examples of which are illustrated in the accompanying drawings. Wherever possible, the same reference numbers are used in the drawings and the description to refer to the same or like parts.

A light-emitting diode (LED) device with simpler processes, good light efficiency and manufacturing methods thereof is provided. The current under lower working bias voltage driven from the electrode of the light-emitting diode device can spread uniformly to the active layer to greatly increase light efficiency.

FIGS. 2A-2E are cross-sectional views of the light-emitting diode device 200 in accordance with the process of a first embodiment of the present invention. A growth substrate 201 (shown in FIG. 2A) such as sapphire, SiC, Si, ZnO, MgO, AlN, GaN or the combinations thereof is provided.

An epitaxial stack 205 (shown in FIG. 2B) is formed on the growth substrate 201 by metal-organic chemical vapor deposition (MOCVD) process wherein the material of the epitaxial stack 205 contains at least the elements of Ga and N and can be, for example, AlGaInN, InGaN or GaN.

In the embodiment, the epitaxial stack 205 including a first type conductivity semiconductor layer 202, an active layer 203 and a second type conductivity semiconductor layer 204 disposed on the growth substrate 201 wherein the first type conductivity semiconductor layer 202 and the second type conductivity semiconductor layer 204 have different conductivity types. For example, the first type conductivity semiconductor layer 202 is an n-type GaN layer and the second type conductivity semiconductor layer 204 is a p-type GaN layer. The active layer 203 can be a multi-quantum well (MQW) structure formed by GaN.

Figure 2A:
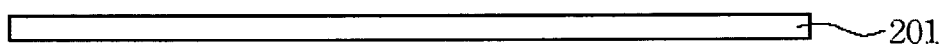
FIGS. 2A-2E are cross-sectional views of the light-emitting diode device 200 in accordance with the process of a first embodiment of the present invention.
Figure 2B:
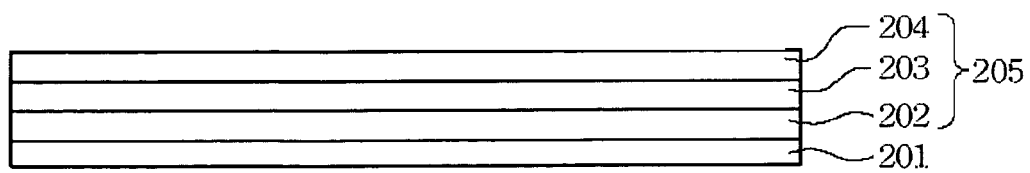
Figure 2C:
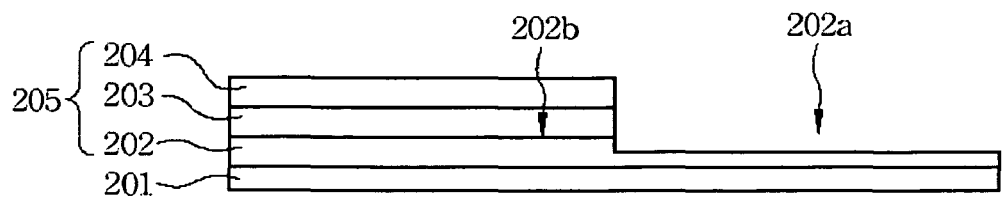

Referring to FIG. 2C, a portion of the second type conductivity semiconductor layer 204 and a portion of the active layer 203 is removed by the removal process like etching process to expose the first portion 202a of the first type conductivity semiconductor layer 202. The remaining portion of the second type conductivity semiconductor layer 204 and the active layer 203 is formed on the second portion 202b of the first type conductivity semiconductor layer 202.

Figure 2D:
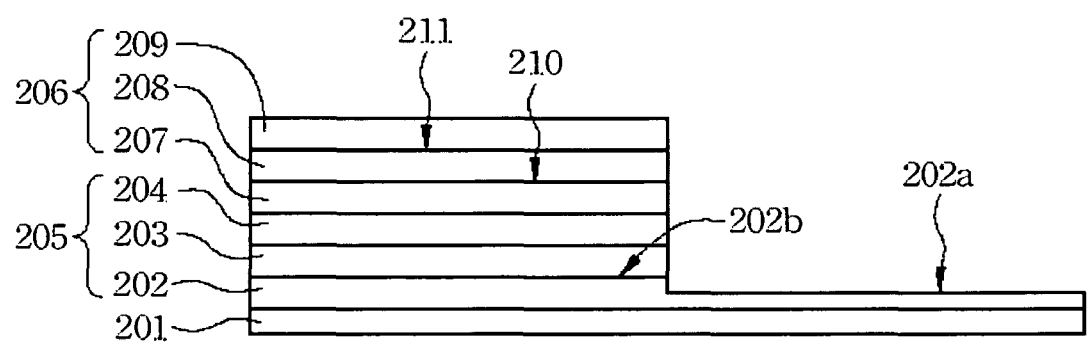

Referring to FIG. 2D, a transparent conductive oxide stack structure 206 is formed on the remaining portion of the second type conductivity semiconductor layer 204. In the embodiment, the materials to form the layers of the transparent conductive oxide stack structure 206 are the same. The same material can be materials composing of same elements with different composition ratios by tuning the deposition parameters of the evaporation process such as adjusting the concentration of the oxygen in the evaporation atmosphere so a plurality of the transparent conductive oxide layers is formed. In the embodiment, the transparent conductive oxide stack structure 206 formed on the second type conductivity semiconductor layer 204 is a multilayer stack structure having at least two resistant interfaces 210 and 211. The material to form the transparent conductive oxide stack structure 206 can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO).

The transparent conductive oxide stack structure 206 includes a first transparent conductive oxide layer 207, a second transparent conductive oxide layer 208 and a third transparent conductive oxide layer 209 stacked subsequently on the second type conductivity semiconductor layer 204 wherein the first transparent conductive oxide layer 207 having a first resistance, the second transparent conductive oxide layer 208 having a second resistance, and the third transparent conductive oxide layer 209 having a third resistance. The third resistance is smaller than the second resistance. The second resistance can be larger or smaller than the first resistance. In this embodiment, the second resistance is larger than both the first and the third resistance. In another embodiment, when the second resistance is smaller than the third resistance, it can be either larger or smaller than the first resistance. Therefore a first resistant interface 210 is formed between the first transparent conductive oxide layer 207 and the second transparent conductive oxide layer 208; a second resistant interface 211 is formed between the second transparent conductive oxide layer 208 and the third transparent conductive oxide layer 209.

Figure 2E:
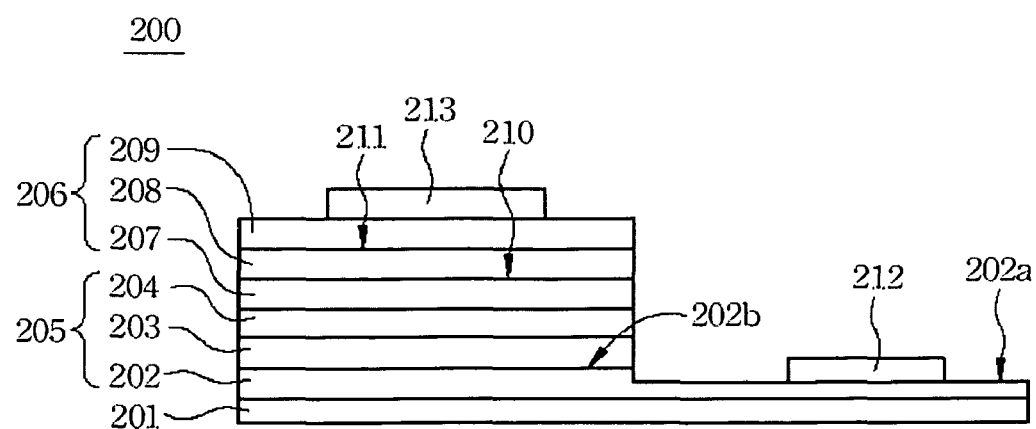

Referring to FIG. 2E, a first electrode 212 is disposed on the exposed first portion 202a of the first type conductivity semiconductor layer 202. A second electrode 213 is disposed on the transparent conductive oxide stack structure 206 to form the light-emitting diode device 200.

The second electrode 213 can be disposed on the same side of the first electrode 212 on the growth substrate 201. The first electrode is made of In, Al, Ti, Au, W, InSn, TiN, WSi, $PtIn_2$, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si or Au/Ni/Ti/Si/Ti. The second electrode 213 is made of Ni/Au, NiO/Au, Pd/Ag/Au/Ti/Au, Pt/Ru, Ti/Pt/Au, Pd/Ni, Ni/Pd/Au, Pt/Ni/Au, Ru/Au, Nb/Au, Co/Au, Pt/Ni/Au, Ni/Pt, NiIn or $Pt_3In_7$.

Because the third transparent conductive oxide layer 209 in the outer side of the transparent conductive oxide stack structure 206 (away from the active layer 203) has lower resistance and the second transparent conductive oxide layer 208 has higher resistance, the current from the second electrode 213 is blocked from spreading to the epitaxial stack 205 directly, and the lateral spread distance of the current in the third transparent conductive oxide layer 209 having lower resistance is then extended. The first transparent conductive oxide layer 207 in the inner side of the transparent conductive oxide stack structure 206 (close to the active layer 203) forms a good ohmic contact with the epitaxial stack 205 because of its lower resistance, so the operation voltage of the light-emitting diode device 200 is lowered.

FIGS. 3A-3E are cross-sectional views of the light-emitting diode device 300 in accordance with the process of a second embodiment of the present invention. A growth substrate 301 (shown in FIG. 3A), such as sapphire, SiC, Si, ZnO, MgO, AlN, GaN, GaP, GaAs, AlGaAs, GaAsP or the combinations thereof is provided.

An epitaxial stack 305 (shown in FIG. 3B) is formed on the growth substrate 301 by metal-organic chemical vapor deposition (MOCVD) process wherein the material of the epitaxial stack 305 contains at least the elements of Ga and N and can be, for example, AlGaInN, GaN, AlGaInP, InGaP, AlGaN, InGaN.

In the embodiment, the epitaxial stack 305 including a first type conductivity semiconductor layer 302, an active layer 303 and a second type conductivity semiconductor layer 304 disposed on the growth substrate 301 subsequently wherein the first type conductivity semiconductor layer 302 and the second type conductivity semiconductor layer 304 have different conductivity types. For example, the first type conductivity semiconductor layer 302 is an n-type GaN layer and the second type conductivity semiconductor layer 304 is a p-type GaN layer. The active layer 303 can be a multi-quantum well (MQW) structure formed by GaN.

Figure 3A:
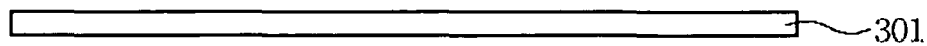
FIGS. 3A-3E are cross-sectional views of the light-emitting diode device 300 in accordance with the process of a second embodiment of the present invention.
Figure 3B:
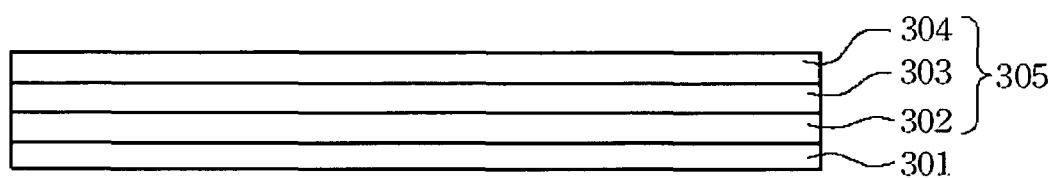
Figure 3C:
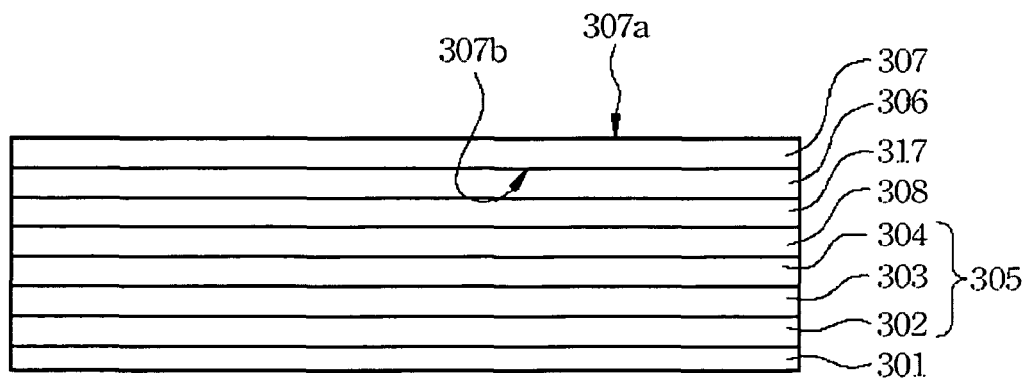

Referring to FIG. 3C, a reflecting layer 317 is formed on the second type conductivity semiconductor layer 304. A permanent substrate 307 with a lower surface 307b is adhered by an adhesion layer 306 to the reflecting layer 317, wherein the reflecting layer 317 is made of Al, Au, Pt, Zn, Ag, Ni, Ge, In, Sn or the combinations thereof. The material of the adhesion layer 306 can be silver epoxy, conductive polymer, Al, Au, Pt, Zn, Ag, Ni, Ge, In, Sn, Ti, Pb, Cu, Pd, or any conductive material containing the materials described above. The permanent substrate 307 can be silicon or metal material.

Furthermore, prior to forming a reflecting layer 317, a contact layer 308 is optionally formed on the second type conductivity semiconductor layer 304. The contact layer 308 is made of Ag, Al, Au, Pt, Ti, Cr, Ni, Ge, Be, Zn, Mg or the combinations thereof.

Figure 3D:
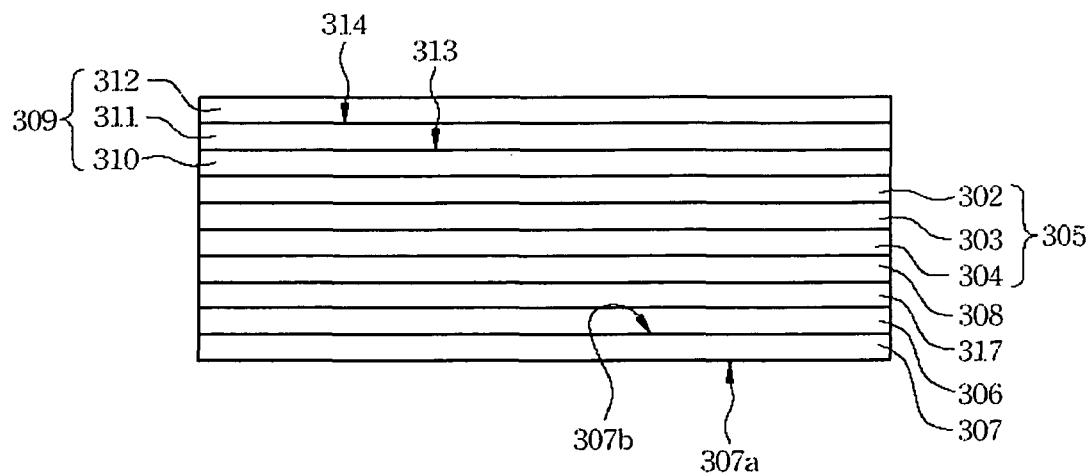

Referring to FIG. 3D, the growth substrate is removed. A transparent conductive oxide stack structure 309 having at least two resistant interfaces 313 and 314 is formed on the first type conductivity semiconductor layer 302.

In the embodiment, the materials to form the layers of the transparent conductive oxide stack structure 309 are the same. The same material can be materials composing of same elements with different composition ratios by tuning the deposition parameters of the evaporation process such as adjusting the concentration of the oxygen in the evaporation atmosphere so a plurality of the transparent conductive oxide layers is formed on the first type conductivity semiconductor layer 302. The transparent conductive oxide stack structure 309 can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO).

The transparent conductive oxide stack structure 309 includes a first transparent conductive oxide layer 310, a second transparent conductive oxide layer 311 and a third transparent conductive oxide layer 312 stacked subsequently on the first type conductivity semiconductor layer 302 wherein the first transparent conductive oxide layer 310 having a first resistance, the second transparent conductive oxide layer 311 having a second resistance, the third transparent conductive oxide layer 312 having a third resistance wherein the third resistance is smaller than the first resistance. The second resistance can be larger or smaller than the first resistance. In this embodiment, the second resistance is larger than both the first and the third resistance. In another embodiment, when the second resistance is smaller than the third resistance, it can be either larger or smaller than the first resistance. Therefore a first resistant interface 313 is formed between the first transparent conductive oxide layer 310 and the second transparent conductive oxide layer 311; a second resistant interface 314 is formed between the second transparent conductive oxide layer 311 and the third transparent conductive oxide layer 312.

Figure 3E:
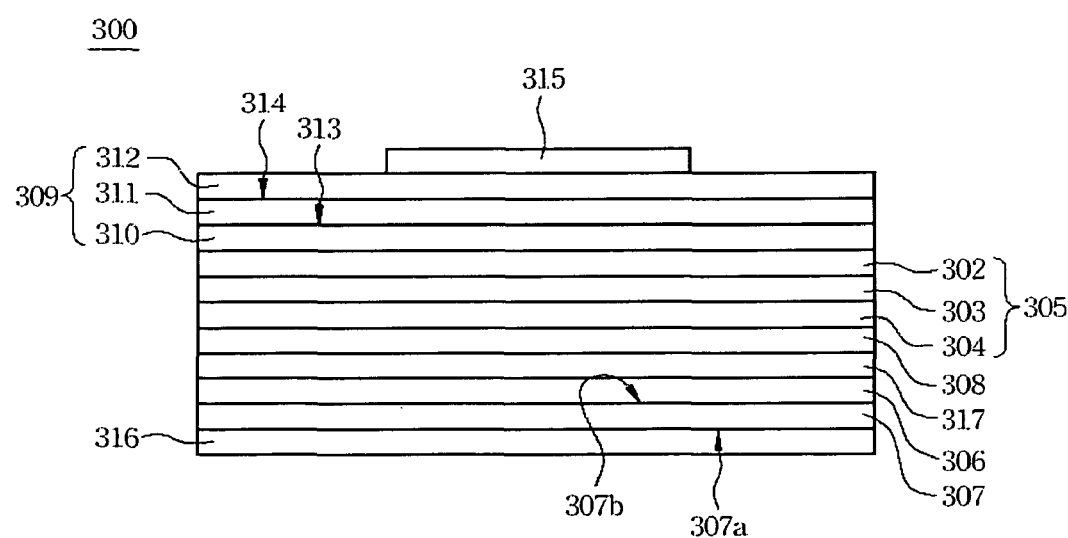

Referring to FIG. 3E, a first electrode 315 is disposed on the transparent conductive oxide stack structure 309. A second electrode 316 is formed on the top surface 307a of the permanent substrate 307 wherein the top surface 307a is disposed on the opposite side of the lower surface 307b of the permanent substrate 307. A light-emitting diode device 300 is formed accordingly.

Because the third transparent conductive oxide layer 312 in the outer side of the transparent conductive oxide stack structure 309 (away from the active layer 303) has lower resistance and the second transparent conductive oxide layer 311 has higher resistance, the current from the first electrode 315 is blocked from spreading to the epitaxial stack 305 directly, and the lateral spread distance of the current in the third transparent conductive oxide layer 312 having lower resistance is then extended. The first transparent conductive oxide layer 310 in the inner side of the transparent conductive oxide stack structure 309 (close to the active layer 303) forms a good ohmic contact with the epitaxial stack 305 because of its lower resistance so the operation voltage of the light-emitting diode device 300 is lowered.

FIGS. 4A-4E are cross-sectional views of the light-emitting diode device 400 in accordance with the process of a third embodiment of the present invention. A growth substrate 401 (shown in FIG. 4A) such as sapphire, SiC, Si, ZnO, MgO, AlN, GaN, GaP, GaAs, AlGaAs, GaAsP or the combinations thereof is provided.

An epitaxial stack 405 (shown in FIG. 4B) is formed on the growth substrate 401 by metal-organic chemical vapor deposition (MOCVD) process, wherein the material of the epitaxial stack 405 contains at least the elements of Ga and N and can be, for example, AlGaInN, GaN, AlGaInP, InGaP, AlGaN, InGaN.

In the embodiment, the epitaxial stack 405 including a first type conductivity semiconductor layer 402, an active layer 403 and a second type conductivity semiconductor layer 404 disposed on the growth substrate 401 wherein the first type conductivity semiconductor layer 402 and the second type conductivity semiconductor layer 404 have different conductivity types. For example, the first type conductivity semiconductor layer 402 is an n-type GaN layer and the second type conductivity semiconductor layer 404 is a p-type GaN layer. The active layer 403 can be a multi-quantum well (MQW) structure formed by GaN.

Figure 4A:
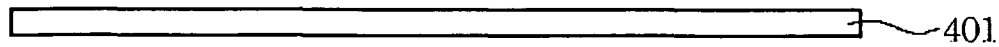
FIGS. 4A-4E are cross-sectional views of the light-emitting diode device 400 in accordance with the process of a third embodiment of the present invention.
Figure 4B:
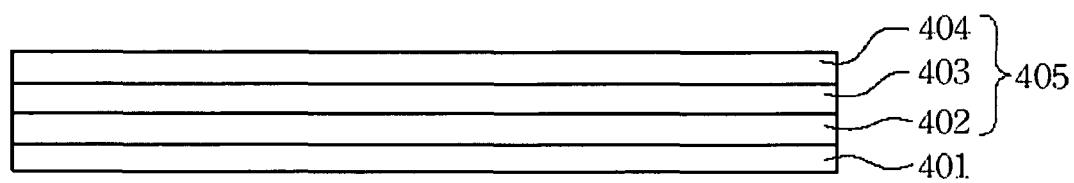
Figure 4C:
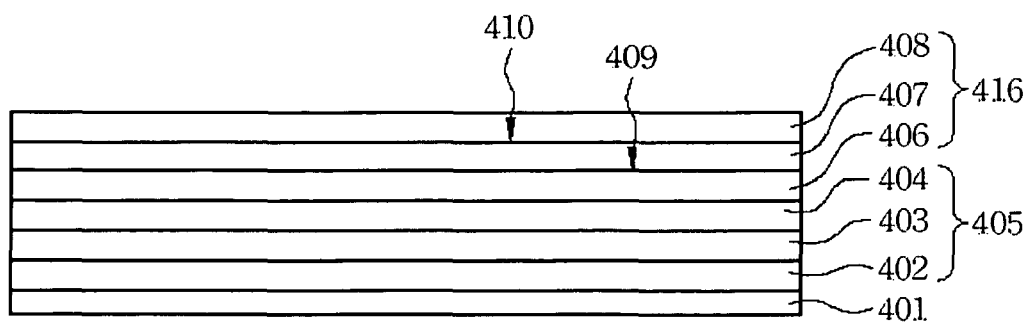

Referring to FIG. 4C, a transparent conductive oxide stack structure 416 having at least two resistant interfaces 409 and 410 is formed on the second type conductivity semiconductor layer 404.

In the embodiment, the materials to form the layers of the transparent conductive oxide stack structure 416 are the same. The same material can be materials composing of same elements with different composition ratios by tuning the deposition parameters of the evaporation process such as adjusting the concentration of the oxygen in the evaporation atmosphere so a plurality of the transparent conductive oxide layers is formed on the second type conductivity semiconductor layer 404. The material to form the transparent conductive oxide stack structure 416 can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO).

The transparent conductive oxide stack structure 416 includes a first transparent conductive oxide layer 406, a second transparent conductive oxide layer 407 and a third transparent conductive oxide layer 408 stacked subsequently on the second type conductivity semiconductor layer 404 wherein the first transparent conductive oxide layer 406 having a first resistance, the second transparent conductive oxide layer 407 having a second resistance, the third transparent conductive oxide layer 408 having a third resistance wherein the third resistance is smaller than the second resistance. The second resistance can be larger or smaller than the first resistance. In another embodiment, when the second resistance is smaller than the third resistance, it can be either larger or smaller than the first resistance. In this embodiment, the second resistance is larger than both the first and the third resistance. Therefore a first resistant interface 409 is formed between the first transparent conductive oxide layer 406 and the second transparent conductive oxide layer 407; a second resistant interface 410 is formed between the second transparent conductive oxide layer 407 and the third transparent conductive oxide layer 408.

Figure 4D:
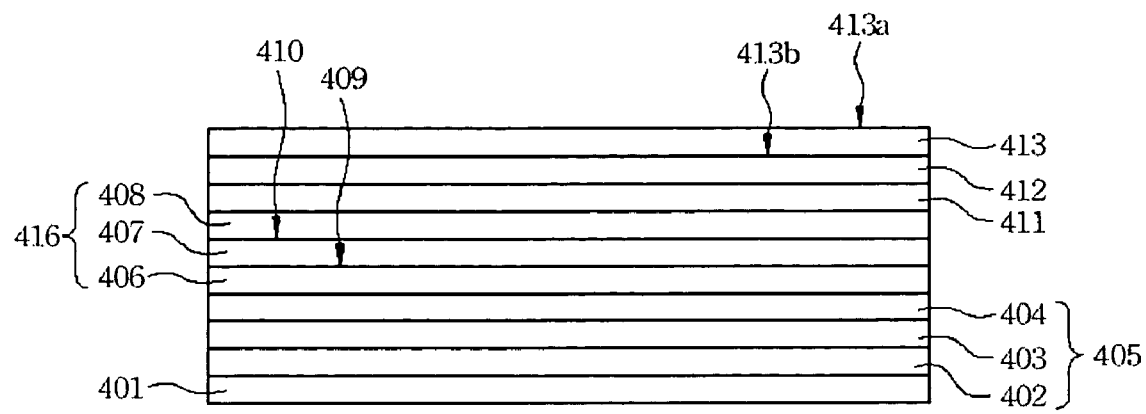

Referring to FIG. 4D, a reflecting layer 411 is formed on the transparent conductive oxide stack structure 416. A lower surface 413b of a permanent substrate 413 is adhered by an adhesion layer 412 to the reflecting layer 411. Wherein the reflecting layer 411 can be Al, Au, Pt, Zn, Ag, Ni, Ge, In, Sn or the combinations thereof. The adhesion layer 412 can be silver epoxy, conductive polymer, Al, Au, Pt, Zn, Ag, Ni, Ge, In, Sn, Ti, Pb, Cu, Pd or any conductive material containing the materials described above. The permanent substrate 307 can be silicon or metal material.

Figure 4E:
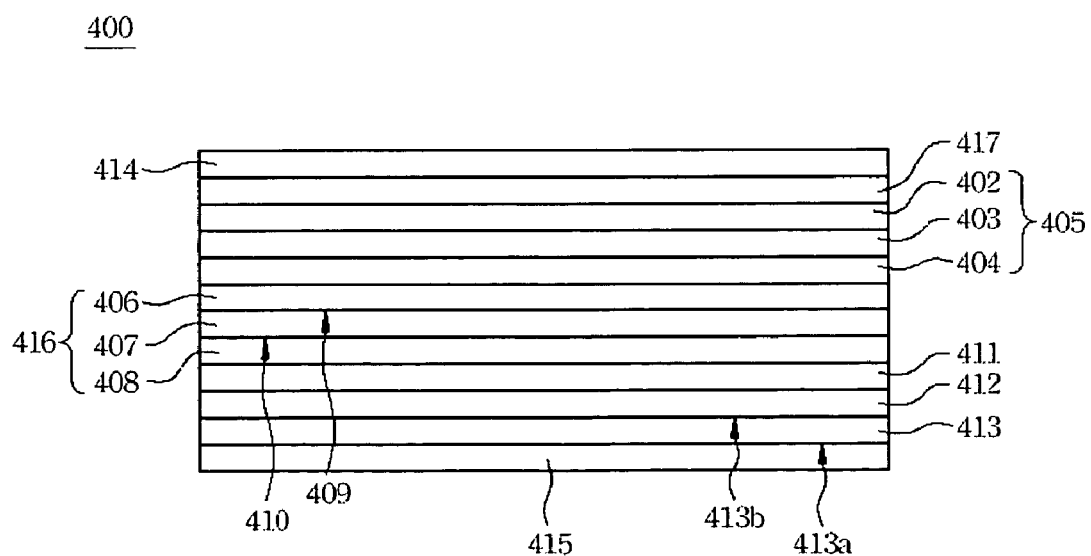

Referring to FIG. 4E, the growth substrate 401 is removed. A first electrode 414 is disposed on the first type conductivity semiconductor layer 402. A second electrode 415 is formed on the top surface 413a of the permanent substrate 413 wherein the top surface 413a is disposed on the opposite side of the lower surface 413b of the permanent substrate 413. A light-emitting diode device 400 is formed accordingly.

In this embodiment, prior to forming a first electrode 414, a contact layer 417 is formed on the first type conductivity semiconductor layer 402 to electrically contact with the first type conductivity semiconductor layer 402. The contact layer 417 can be Ag, Al, Au, Pt, Ti, Cr, Ni, Ge, Be, Zn, Mg or the combinations thereof.

Because the third transparent conductive oxide layer 408 in the outer side of the transparent conductive oxide stack structure 416 (away from the active layer 403) has lower resistance and the second transparent conductive oxide layer 407 has higher resistance, the current from the second electrode 415 is blocked from spreading to the epitaxial stack 405 directly, and the lateral spread distance of the current in the third transparent conductive oxide layer 408 having lower resistance is then extended. The first transparent conductive oxide layer 406 in the inner side of the transparent conductive oxide stack structure 416 (close to the active layer 403) forms a good ohmic contact with the epitaxial stack 405 because of its lower resistance, so the operation voltage of the light-emitting diode device 400 is lowered.

FIGS. 5A-5E are cross-sectional views of the light-emitting diode device 500 in accordance with the process of a fourth embodiment of the present invention. A growth substrate 501 (shown in FIG. 5A) such as sapphire, SiC, Si, ZnO, MgO, AlN, GaN, GaP, GaAs, AlGaAs, GaAsP or the combinations thereof is provided.

An epitaxial stack 505 (shown in FIG. 5B) is formed on the growth substrate 501 by metal-organic chemical vapor deposition (MOCVD) process, wherein the material of the epitaxial stack 505 contains at least the elements of Ga and N and can be, for example, AlGaInN, GaN, AlGaInP, InGaP, AlGaN, InGaN or the combinations thereof.

In the embodiment, the epitaxial stack 505 including a first type conductivity semiconductor layer 502, an active layer 503 and a second type conductivity semiconductor layer 504 disposed on the growth substrate 501 wherein the first type conductivity semiconductor layer 502 and the second type conductivity semiconductor layer 504 have different conductivity types. For example, the first type conductivity semiconductor layer 502 is an n-type GaN layer and the second type conductivity semiconductor layer 504 is a p-type GaN layer. The active layer 503 can be a multi-quantum well (MQW) structure formed by GaN.

Figure 5A:
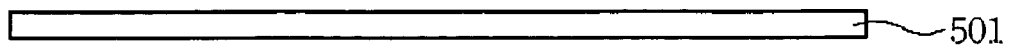
FIGS. 5A-5F are cross-sectional views of the light-emitting diode device 500 in accordance with the process of a fourth embodiment of the present invention.
Figure 5B:
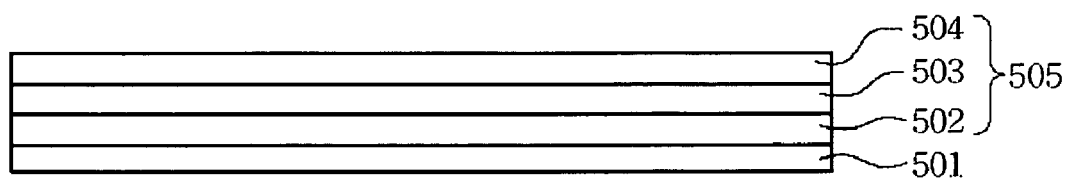
Figure 5C:
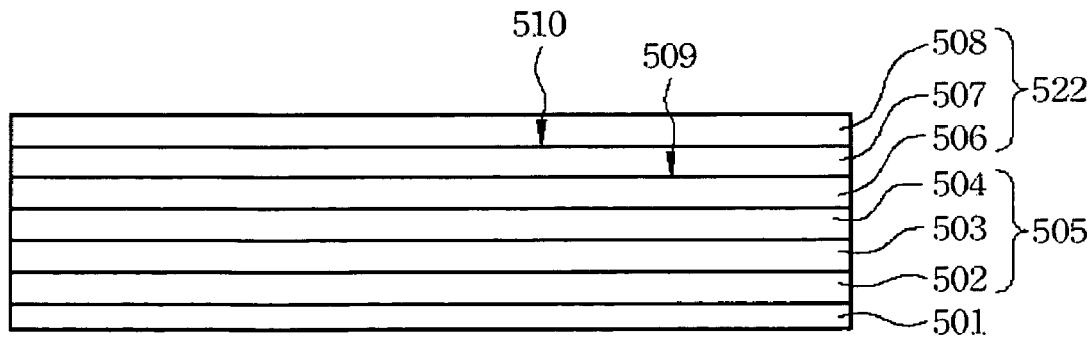

Referring to FIG. 5C, a first transparent conductive oxide stack structure 522 having at least two resistant interfaces 509 and 510 is formed on the second type conductivity semiconductor layer 504.

In the embodiment, the materials to form the layers of the transparent conductive oxide stack structure 522 are the same. The same material can be materials composing of same elements with different composition ratios by tuning the deposition parameters of the evaporation process such as adjusting the concentration of the oxygen in the evaporation atmosphere so a plurality of the transparent conductive oxide layers is formed on the second type conductivity semiconductor layer 504. The material to form the transparent conductive oxide stack structure 522 can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO).

The first transparent conductive oxide stack structure 522 includes a fourth transparent conductive oxide layer 506, a fifth transparent conductive oxide layer 507 and a sixth transparent conductive oxide layer 508 stacked subsequently on the second type conductivity semiconductor layer 504 wherein the fourth transparent conductive oxide layer 506 having a fourth resistance, the fifth transparent conductive oxide layer 507 having a fifth resistance, the sixth transparent conductive oxide layer 508 having a sixth resistance wherein the fifth resistance is smaller than the sixth resistance. The fifth resistance can be larger or smaller than the fourth resistance. In another embodiment, when the fifth resistance is smaller than the sixth resistance, it can be either larger or smaller than the fourth resistance. In this embodiment, the fifth resistance is larger both than the fourth and the sixth resistance. Therefore a third resistant interface 509 is formed between the fourth transparent conductive oxide layer 506 and the fifth transparent conductive oxide layer 507; a fourth resistant interface 510 is formed between the fifth transparent conductive oxide layer 507 and the sixth transparent conductive oxide layer 508.

Figure 5D:
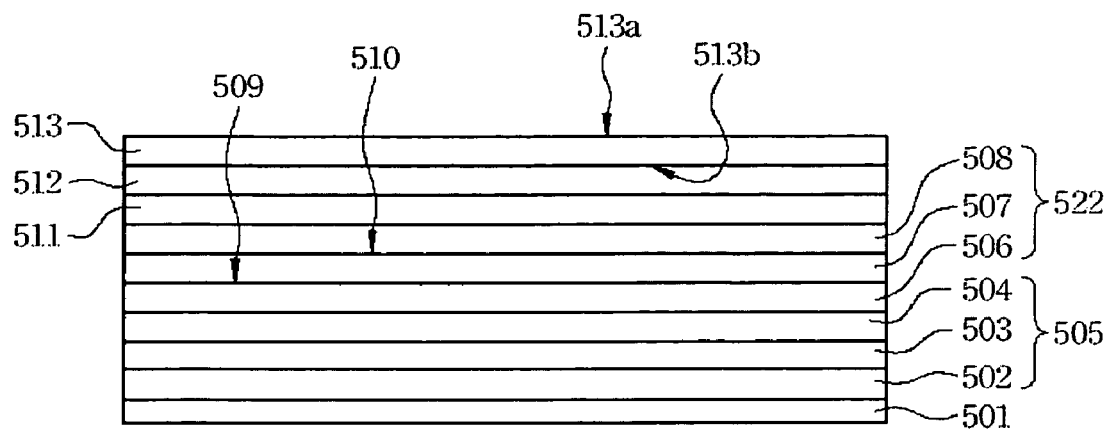

Referring to FIG. 5D, a reflecting layer 511 is formed on the first transparent conductive oxide stack structure 522. A lower surface 513b of a permanent substrate 513 is adhered by an adhesion layer 512 to the reflecting layer 511. Wherein the reflecting layer 511 can be Al, Au, Pt, Zn, Ag, Ni, Ge, In, Sn or the combinations thereof. The adhesion layer 512 can be silver epoxy, conductive polymer, Al, Au, Pt, Zn, Ag, Ni, Ge, In, Sn, Ti, Pb, Cu, Pd or any conductive material containing the materials described above. The permanent substrate 513 can be silicon or metal material.

Figure 5E:
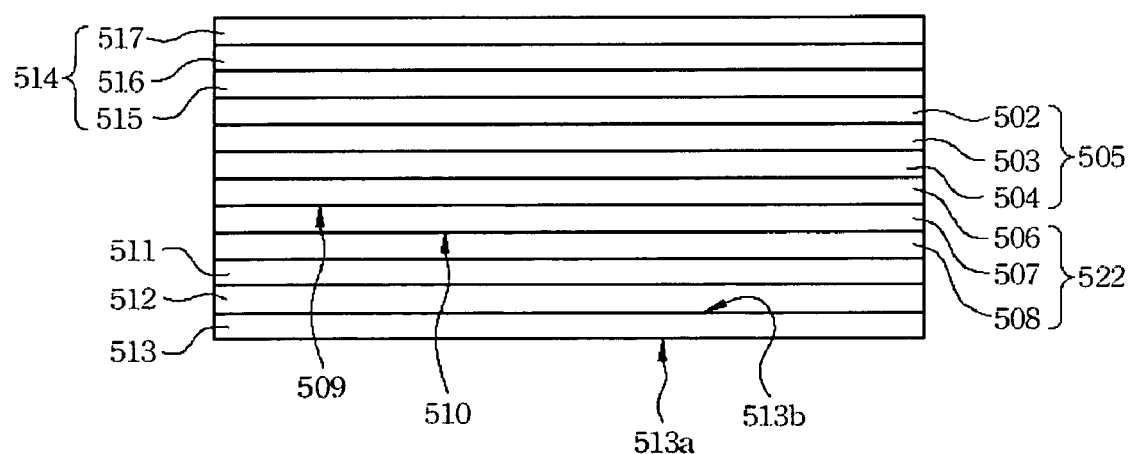

Referring to FIG. 5E, the growth substrate 501 is removed. A second transparent conductive oxide stack structure 514 having at least two resistant interfaces is formed on the first type conductivity semiconductor layer 502.

In another embodiment, the materials to form the layers of the second transparent conductive oxide stack structure 514 are the same. The same material can be materials composing of same elements with different composition ratios by tuning the deposition parameters of the evaporation process such as adjusting the concentration of the oxygen in the evaporation atmosphere so a plurality of the transparent conductive oxide layers is formed on the first type conductivity semiconductor layer 502. The second transparent conductive oxide stack structure 514 can be indium tin oxide (ITO), indium zinc oxide (IZO), cadmium tin oxide (CTO), zinc oxide (ZnO), indium oxide (In$_2$O$_3$), tin oxide (SnO$_2$), copper aluminum oxide, aluminum gallium oxide, aluminum strontium oxide or aluminum zinc oxide (AZO).

In this embodiment, the second transparent conductive oxide stack structure 514 is a stack structure with multilayer having at least two resistant interfaces.

In this embodiment, the second transparent conductive oxide stack structure 514 includes a first transparent conductive oxide layer 515, a second transparent conductive oxide layer 516 and a third transparent conductive oxide layer 517 stacked subsequently on the first type conductivity semiconductor layer 502 wherein the first transparent conductive oxide layer 515 having a first resistance, the second transparent conductive oxide layer 516 having a second resistance, the third transparent conductive oxide layer 517 having a third resistance wherein the second resistance is larger than the third resistance. The second resistance can be larger or smaller than the first resistance.

In other embodiments, the second resistance is smaller than the third resistance and the second resistance can be larger or smaller than the first resistance. In this embodiment, the second resistance is larger than both the first and the third resistance. But in some embodiments, the second resistance is smaller than the first resistance. Therefore a first resistant interface 518 is formed between the first transparent conductive oxide layer 515 and the second transparent conductive oxide layer 516; a second resistant interface 519 is formed between the second transparent conductive oxide layer 516 and the third transparent conductive oxide layer 517.

Figure 5F:
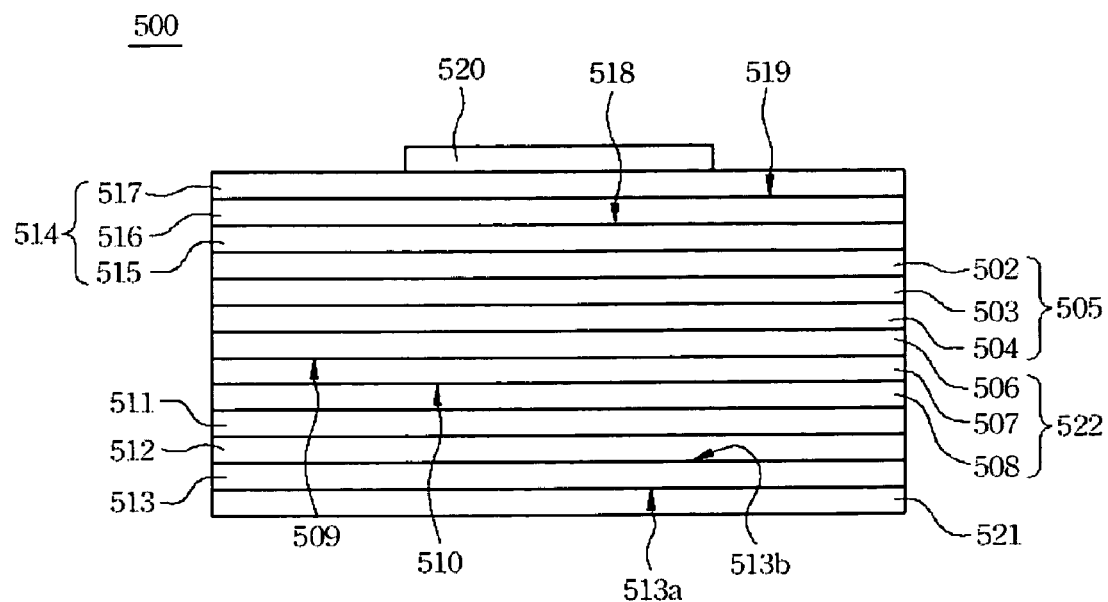

Referring to FIG. 5F, A first electrode 520 is formed on the second transparent conductive oxide stack structure 514; A second electrode 521 is formed on the top surface 513a of the permanent substrate 513 wherein the top surface 513a is disposed on the opposite side of the lower surface 513b of the permanent substrate 513 to form the light-emitting diode device 500.

Because the transparent conductive oxide layer in the outer side of the transparent conductive oxide stack structure (away from the active layer) has lower resistance and the second transparent conductive oxide layer 516 and the fifth transparent conductive oxide layer 507 have higher resistance, the current from the front side electrode is blocked from spreading to the epitaxial stack 505 directly, and the lateral spread distance of the current in transparent conductive oxide layer having lower resistance is then extended. The transparent conductive oxide layer in the inner side of the transparent conductive oxide stack structure (close to the active layer) forms a good ohmic contact with the epitaxial stack 505 because of its lower resistance, so the operation voltage of the light-emitting diode device 500 is lowered.

The feature of the evaporation process in accordance with the embodiments described above in the invention, the two transparent conductive oxide stack structures having at least two resistant interfaces is formed between the semiconductor stack structure and the front side electrode of the light-emitting diode device. It can spread the currents derived from the electrode to the active layer of the light-emitting diode device efficiently to solve the issue of current crowding effect and the overhigh operation voltage of the current blocking layer in the conventional light-emitting diode device.

Because of the transparent conductive oxide stack structures are formed by evaporation process, the light-emitting diode device in accordance with this invention having the advantages of simpler processes, low operation voltage and better light efficiency.

Figure 6:
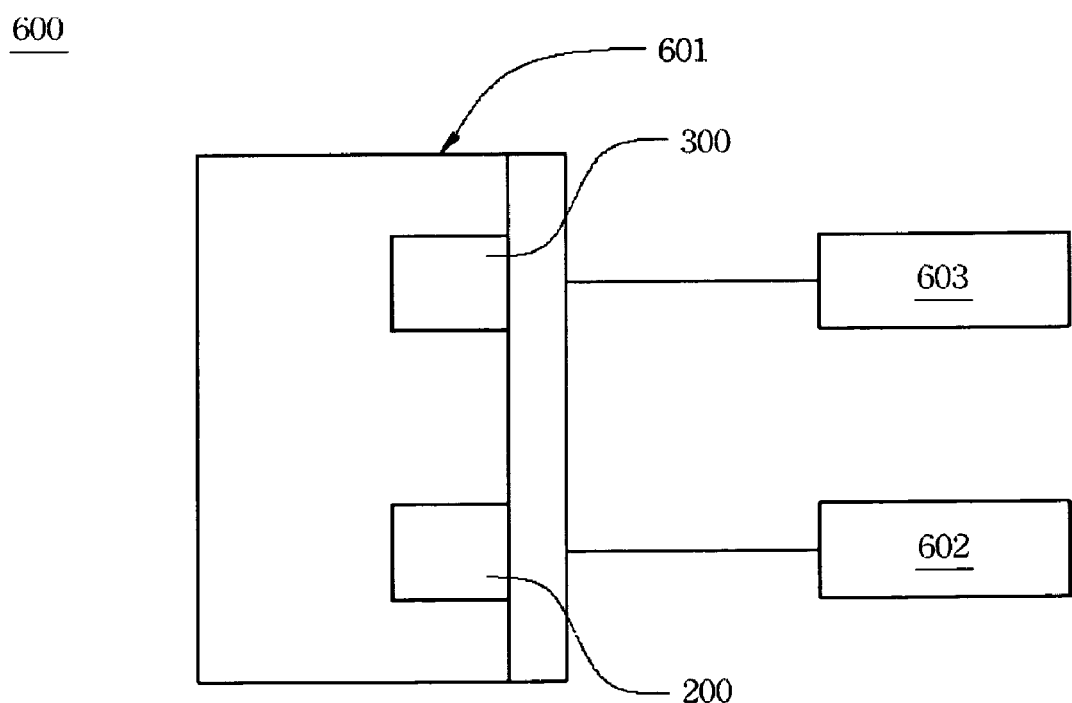
FIG. 6 is an illustration of the lighting device in accordance with the embodiment of the present invention.

In addition, the light-emitting device described above can be used as a backlight module in the liquid crystal display or a lighting device. FIG. 6 is an illustration of the lighting device 600 containing the light-emitting diode device in accordance with the embodiments of the present invention shown in FIGS. 2E, 3E, 4E and 5F.

The lighting device 600 includes a lighting element 601, a power supplement system 602 and a control element 603, wherein the lighting element 601 including at least a light-emitting diode device chosen from the light-emitting diode device 200, 300, 400, 500 or the combinations thereof in FIG. 2E, 3E, 4E or 5F. In this embodiment, the light source is formed by the light-emitting diode device 200 and 300.

The power supplement system 602 electrically connects to the lighting element 601; the control element 603 such as a switch electrically connects to the power supplement system 602 or the lighting element 601 to control the current to the lighting element 601.

Figure 7A:
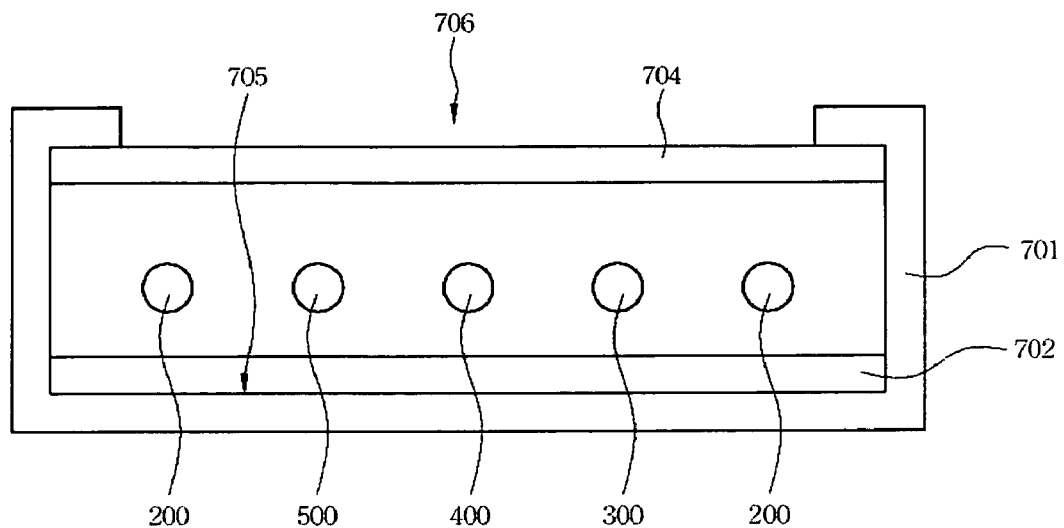
FIG. 7A is an illustration of the backlight module in accordance with the embodiment of the present invention.
Figure 7B:
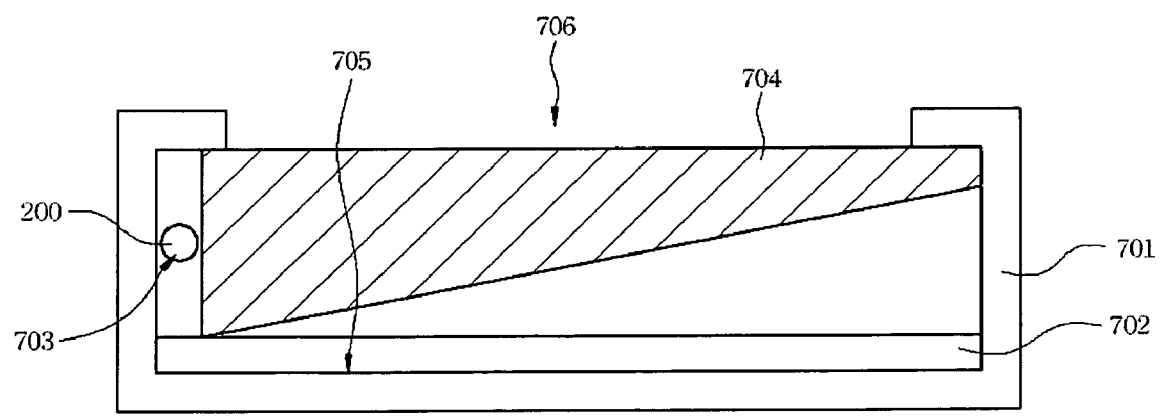
FIG. 7B is an illustration of the backlight module in accordance with another embodiment of the present invention.

FIGS. 7A and 7B illustrate of the backlight modules separately containing the light-emitting diode device in accordance with the embodiments of the present invention shown in FIGS. 2E, 3E, 4E and 5F.

The backlight module of present invention includes a back bezel 701, a reflector 702, a light source 703, and an optical film 704. The back bezel 701 is a shell structure including a bottom side 705 and a light extraction side 706. The reflector 702 disposed between the bottom side 705 and the light extraction side 706. In a preferred embodiment, the reflector 702 is a light reflecting layer coated on the bottom side 705. A light source 703 is disposed between the reflector 702 and the light extraction side 706 and includes a least a light-emitting diode device 200, 300, 400 or 500 or the combinations thereof showing in FIG. 2E, 3E, 4E or 5F. The optical film is formed between the light source 703 and the light extraction side 706. In the embodiment of the embodiment, the light source is disposed right under the light extraction side 706 and the optical film 704 (referring to the backlight module 700A in FIG. 7A.) Parts of the light provided from the light source 703 is directly passing the optical film 704 for optical processing and extracting out from the light extraction side 706. In another embodiment of this invention, the light source 703 of the light-emitting diode device 200 is disposed on one side of the inner surface of the back bezel 701 (referring to the backlight module 700B in FIG. 7B.) The light provided from the light source 703 needs to pass the optical film 704 for optical processing and extracting out from the light extraction side 706.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Such as the embodiments of this invention, the transparent conductive oxide stack structure is a multilayer stack structure and the three layers structure of the transparent conductive oxide stack structure is illustrated in the aforementioned embodiment. But in other embodiments, the transparent conductive oxide stack structure can contain the multilayer more than 3 layers. The resistance of each transparent conductive oxide layer is variable according to the different optical requirement or design. Therefore, the scope of this invention is decided by the appended claims.

What is claimed is:

1. A light-emitting diode device structure comprising:
   a substrate;
   a first type conductivity semiconductor layer disposed on the substrate having a first portion and a second portion;
   an active layer disposed on the first portion;
   a second type conductivity semiconductor layer disposed on the active layer;
   a transparent conductive oxide stack structure having a plurality of transparent conductive layers and at least two resistant interfaces disposed on the second type conductivity semiconductor layer wherein any two adjacent layers of the plurality of transparent conductive layers having the same materials with different composition ratios; and
   an electrode disposed on the transparent conductive oxide stack structure.

2. The light-emitting diode device structure according to claim 1, wherein the transparent conductive oxide stack structure comprising:
   a first transparent conductive layer having a first resistance disposed on the second type conductivity semiconductor layer;
   a second transparent conductive layer having a second resistance disposed on the first transparent conductive layer, wherein a first resistant interface is formed between the first transparent conductive layer and the second transparent conductive layer; and
   a third transparent conductive layer having a third resistance disposed on the second transparent conductive layer, wherein a second resistant interface is formed between the second transparent conductive layer and the third transparent conductive layer; wherein the second resistance is different from the first resistance and the third resistance.

3. The light-emitting diode device structure according to claim 1, wherein the transparent conductive oxide stack structure can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO) or the combinations thereof.

4. The light-emitting diode device structure according to claim 1, wherein the materials to form all of the layers of the transparent conductive oxide stack structure are the same.

5. A light-emitting diode device structure comprising:
   a substrate having a top surface and a lower surface opposite to the top surface;
   a second type conductivity semiconductor layer disposed on the top surface;
   an active layer disposed on the second type conductivity semiconductor layer;
   a first type conductivity semiconductor layer disposed on the active layer;
   a transparent conductive oxide stack structure having a plurality of transparent conductive layers and at least two resistant interfaces disposed on the first type conductivity semiconductor layer wherein any two adjacent layers of the plurality of transparent conductive layers having the same materials with different composition ratios; and
   an electrode disposed on the transparent conductive oxide stack structure.

6. The light-emitting diode device structure according to claim 5, wherein the transparent conductive oxide stack structure comprising:
   a first transparent conductive layer having a first resistance disposed on the first type conductivity semiconductor layer;
   a second transparent conductive layer having a second resistance disposed on the first transparent conductive layer, wherein a first resistant interface is formed between the first transparent conductive layer and the second transparent conductive layer; and
   a third transparent conductive layer having a third resistance disposed on the second transparent conductive layer, wherein a second resistant interface is formed between the second transparent conductive layer and the third transparent conductive layer; wherein the second resistance is different from the first resistance and the third resistance.

7. The light-emitting diode device structure according to claim 5, wherein the transparent conductive oxide stack structure can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO) or the combinations thereof.

8. The light-emitting diode device structure according to claim 5, wherein the materials to form all of the layers of the transparent conductive oxide stack structure are the same.

9. The light-emitting diode device structure according to claim 5, further comprising:
   an adhesion layer disposed on the top surface of the substrate;
   a reflecting layer disposed on the adhesion layer; and
   a contact layer disposed on the reflecting layer and contact with the second type conductivity semiconductor layer.

10. A light-emitting diode device structure comprising:
    a substrate having a top surface and a lower surface opposite to the top surface;
    a first transparent conductive oxide stack structure having a plurality of transparent conductive layers and at least two resistant interfaces disposed on the top surface of the substrate wherein any two adjacent layers of the plurality of transparent conductive layers having the same materials with different composition ratios;

a second type conductivity semiconductor layer disposed on the first transparent conductive oxide stack structure;

an active layer disposed on the second type conductivity semiconductor layer;

a first type conductivity semiconductor layer disposed on the active layer; and an electrode disposed on the first type conductivity semiconductor layer.

11. The light-emitting diode device structure according to claim 10, wherein the first transparent conductive oxide stack structure comprising:

a first transparent conductive layer having a first resistance disposed on the top surface of the substrate;

a second transparent conductive layer having a second resistance disposed on the first transparent conductive layer, wherein a first resistant interface is formed between the first transparent conductive layer and the second transparent conductive layer; and a third transparent conductive layer having a third resistance disposed on the second transparent conductive layer, wherein a second resistant interface is formed between the second transparent conductive layer and the third transparent conductive layer; wherein the second resistance is different from the first resistance and the third resistance.

12. The light-emitting diode device structure according to claim 10, further comprising a second transparent conductive oxide stack structure having at least two resistant interfaces disposed between the first type conductivity semiconductor layer and the electrode.

13. The light-emitting diode device structure according to claim 12, wherein the second transparent conductive oxide stack structure is a multilayer stack structure comprising:

a fourth transparent conductive layer having a fourth resistance disposed on the first type conductivity semiconductor layer;

a fifth transparent conductive layer having a fifth resistance disposed on the fourth transparent conductive layer wherein a third resistant interface formed between the fourth transparent conductive layer and the fifth transparent conductive layer; and a sixth transparent conductive layer having a sixth resistance disposed on the fifth transparent conductive layer wherein a fourth resistant interface formed between the fifth transparent conductive layer and the sixth transparent conductive layer; wherein the fifth resistance is different from the fourth resistance and the sixth resistance.

14. The light-emitting diode device structure according to claim 12, wherein the first transparent conductive oxide stack structure and the second transparent conductive oxide stack structure can be indium tin oxide (ITO), indium zinc oxide (IZO), cadmium tin oxide (CTO), zinc oxide (ZnO), indium oxide ($In_2O_3$), tin oxide ($SnO_2$), copper aluminum oxide, aluminum gallium oxide, aluminum strontium oxide or aluminum zinc oxide (AZO) or the combinations thereof.

15. The light-emitting diode device structure according to claim 12, wherein the materials to form all of the layers of the first or second transparent conductive oxide stack structure are the same.

16. The light-emitting diode device structure according to claim 10, further comprising:

an adhesion layer disposed on the top surface of the substrate;

a reflecting layer disposed on the adhesion layer; and a contact layer disposed on the reflecting layer and contact with the first transparent conductive oxide stack structure.

17. A backlight module comprising:

a back bezel having a bottom side and a light extraction side;

a reflector disposed between the bottom side and the light extraction side;

a light source disposed between the reflector and the light extraction side comprising the light-emitting diode device structure according to claim 5; and an optical film disposed between the light source and the light extraction side.

18. A lighting device comprising:

a light source comprising the light-emitting diode device structure according to claim 5;

a power supplement system electrically adhering to the light source; and a control element electrically adhering to the power supplement system to control the current to the light source.

* * * * *